United States Patent
Hodota

(10) Patent No.: US 8,097,478 B2
(45) Date of Patent: Jan. 17, 2012

(54) METHOD FOR PRODUCING LIGHT-EMITTING DIODE

(75) Inventor: Takashi Hodota, Ichihara (JP)

(73) Assignee: Showa Denko K.K., Tokyo (JP)

( * ) Notice: Subject to any disclaimer, the term of this patent is extended or adjusted under 35 U.S.C. 154(b) by 210 days.

(21) Appl. No.: 12/666,192

(22) PCT Filed: Jun. 26, 2008

(86) PCT No.: PCT/JP2008/061654
§ 371 (c)(1),
(2), (4) Date: Dec. 22, 2009

(87) PCT Pub. No.: WO2009/004980
PCT Pub. Date: Jan. 8, 2009

(65) Prior Publication Data
US 2010/0203661 A1     Aug. 12, 2010

(30) Foreign Application Priority Data
Jun. 29, 2007   (JP) ................................. 2007-171920

(51) Int. Cl.
*H01L 21/00* (2006.01)
(52) U.S. Cl. .............. 438/29; 438/22; 438/33; 438/719; 257/E21.001
(58) Field of Classification Search .................... 438/29, 438/33; 257/E21.001
See application file for complete search history.

(56) References Cited

U.S. PATENT DOCUMENTS

| 7,897,420 B2 * | 3/2011 | Chu et al. ........................ 438/29 |
| 2005/0173725 A1 | 8/2005 | Kunisato et al. |
| 2005/0184299 A1 | 8/2005 | Matsumura et al. |
| 2005/0199891 A1 | 9/2005 | Kunisato et al. |
| 2006/0284195 A1 | 12/2006 | Nagai |
| 2007/0020789 A1 | 1/2007 | Lee et al. |
| 2007/0077673 A1 | 4/2007 | Hwang et al. |
| 2007/0295952 A1 * | 12/2007 | Jang et al. ........................ 257/15 |
| 2008/0121908 A1 * | 5/2008 | Yuan et al. ........................ 257/94 |

FOREIGN PATENT DOCUMENTS

| JP | 2005-223165 A | 8/2005 |
| JP | 2005-252222 A | 9/2005 |
| JP | 2005-259832 A | 9/2005 |
| JP | 2005-268769 A | 9/2005 |
| JP | 2007-019511 A | 1/2007 |
| JP | 2007-103934 A | 4/2007 |
| WO | 2005/029572 A1 | 3/2005 |
| WO | 2005/029573 A1 | 3/2005 |
| WO | 2007/032421 A1 | 3/2007 |

* cited by examiner

*Primary Examiner* — Angel Roman
(74) *Attorney, Agent, or Firm* — Sughrue Mion, PLLC

(57) ABSTRACT

The present invention provides a method for producing a light-emitting diode, the method comprising a lamination step of forming a laminated semiconductor layer by sequentially laminating an n-type semiconductor layer, a light-emitting layer and a p-type semiconductor layer onto a substrate, as well as forming a plurality of reflective p-type electrodes on top of the p-type semiconductor layer, a plating step of forming a seed layer that covers the reflective p-type electrodes and the p-type semiconductor layer, and fowling a plating layer on top of the seed layer, a removal step of removing the substrate from the n-type semiconductor layer, thereby exposing a light extraction surface of the n-type semiconductor layer, and an electrode formation step of performing dry etching of the light extraction surface of the n-type semiconductor layer using an etching gas containing the same element as a dopant element within the n-type semiconductor layer, and subsequently forming an n-type electrode on the light extraction surface.

12 Claims, 6 Drawing Sheets

(a)

(b)

(c)

(d)

METHOD FOR PRODUCING LIGHT-EMITTING DIODE

TECHNICAL FIELD

The present invention relates to a method for producing a light-emitting diode.

Priority is claimed on Japanese Patent Application No. 2007-171920, filed Jun. 29, 2007, the content of which is incorporated herein by reference.

BACKGROUND ART

Group-III nitride semiconductors have a direct transition-type band gap at energy levels corresponding with a range from visible light to the ultraviolet light region and also exhibit excellent light emission efficiency, and have therefore been widely commercialized as semiconductor light-emitting elements such as light-emitting diodes (LED) and laser diodes (LD) for use in all manner of applications. Further, even when used within electronic devices, group-III nitride semiconductors have the potential to yield superior properties to those obtainable using conventional group III-V compound semiconductors.

Generally, group-III nitride semiconductors are produced by a metal-organic chemical vapor deposition (MOCVD) method, using trimethyl gallium, trimethyl aluminum and ammonia as raw materials. MOCVD is a method in which vapors of the raw materials are incorporated within a carrier gas and transported to a substrate surface, and the raw materials are then decomposed by reaction with the heated substrate, causing crystal growth on the substrate surface.

Examples of materials that are known to be usable as the substrate include insulating substrates such as sapphire, and conductive substrates such as silicon carbide, silicon, zinc oxide and gallium arsenide, but a substrate that enables perfect lattice matching with group-III nitride semiconductors is yet to be developed, and currently, blue LED elements prepared by enforced growth of a group-III nitride semiconductor layer on a sapphire substrate in which the lattice constant mismatch is 10% or greater are being used in practical applications.

Conventional blue LED elements have a double hetero structure in which, basically, an n-type semiconductor layer, a light-emitting layer and a p-type semiconductor layer composed of a group-III nitride semiconductor are laminated in sequence on a sapphire substrate. As mentioned above, sapphire has insulating properties, meaning an electrode cannot be drawn from the substrate side of the element, and therefore the element is produced with a so-called face-up structure or flip-chip structure in which a p-type electrode and an n-type electrode are provided on the same surface of the group-III nitride semiconductor layer.

However, conventional elements having face-up structure or flip-chip structure that use sapphire as a substrate have numerous problems. Firstly, because the p-type electrode and the n-type electrode are aligned horizontally, the electric current flows in a horizontal direction, and as a result, the current density tends to increase in localized areas, causing the chip to heat up. Secondly, because the sapphire that is used as the substrate is extremely hard and does not exhibit cleavability, high level technology is required to generate the chips. Thirdly, the thermal conductivity of sapphire is comparatively low, and therefore the heat generated in the group-III nitride semiconductor layer cannot be dissipated efficiently.

In order to address the above types of problems, WO05/029572 discloses a method of producing a light-emitting diode having an upper-lower electrode structure in which a group-III nitride semiconductor layer is formed on top of a plating layer. In other words, WO05/029572 discloses a method for producing a light-emitting diode having an upper-lower electrode structure, the method including: sequentially laminating an n-type semiconductor layer, a light-emitting layer and a p-type semiconductor layer on top of a sapphire substrate to form a group-III nitride semiconductor layer, forming a p-type ohmic electrode on one surface of the p-type semiconductor layer, forming a seed layer on top of the p-type ohmic electrode, subsequently forming a photoresist in a lattice shape on top of the seed layer, thereafter forming a plating layer that covers the seed layer and the photoresist, subsequently removing the sapphire substrate and then forming an n-type ohmic electrode on the n-type semiconductor layer, and finally, removing the photoresist and performing dicing.

DISCLOSURE OF INVENTION

Problems to be Solved by the Invention

However, in WO05/029572 mentioned above, when the sapphire substrate is removed and the n-type ohmic electrode is formed, an annealing treatment must be conducted together with the formation of the electrode layer, so that the adjoining surface between the electrode layer and the n-type semiconductor layer is formed as an ohmic junction. The temperature during this annealing treatment is usually approximately several hundred ° C., and in those cases where the p-type ohmic electrode also functions as a reflective layer, the annealing treatment may result in a degradation in the p-type ohmic electrode caused by migration of Ag and the like, resulting in a dramatic reduction in the reflectance and a deterioration in the light extraction efficiency of the light-emitting diode.

The present invention takes the above circumstances into consideration, with an object of providing a method for producing a light-emitting diode having an upper-lower electrode structure, in which by providing a plating layer instead of a sapphire substrate, an upper-lower electrode structure can be realized and the problem of heat dissipation can be resolved, and in which an annealing treatment need not be conducted during formation of the ohmic electrode.

Means to Solve the Problems

In order to achieve the above object, the present invention adopts the constitutions described below.

[1] A method for producing a light-emitting diode, said method comprising a lamination step of forming a laminated semiconductor layer by sequentially laminating an n-type semiconductor layer, a light-emitting layer and a p-type semiconductor layer onto a substrate, as well as forming a plurality of reflective p-type electrodes on top of the p-type semiconductor layer, a plating step of forming a seed layer that covers the reflective p-type electrodes and the p-type semiconductor layer, and forming a plating layer on top of the seed layer, a removal step of removing the substrate from the n-type semiconductor layer, thereby exposing a light extraction surface of the n-type semiconductor layer, and an electrode formation step of performing dry etching of the light extraction surface of the n-type semiconductor layer using an etching gas comprising an identical element to a dopant element within the n-type semiconductor layer, and subsequently forming an n-type electrode on the light extraction surface.

[2] The method for producing a light-emitting diode according to [1] above, wherein the dopant element within the n-type semiconductor layer is silicon, and the etching gas is a silicon halide.

[3] The method for producing a light-emitting diode according to [1] or [2] above, wherein in the lamination step, the reflective p-type electrodes are formed using an RF sputtering method.

[4] The method for producing a light-emitting diode according to any one of [1] to [3] above, wherein in the plating step, following formation of the seed layer, an isolating photoresist is formed along boundary portions that mutually isolate the plurality of reflective p-type electrodes, and the plating layer is then formed so as to cover the isolating photoresist, an additional partitioning step of forming partitioning slots in the laminated semiconductor layer on a side of the light extraction surface side and along the isolating photoresist at the boundary portions is provided between the removal step and the electrode formation step, and a dicing step is provided in which, following the electrode formation step, the plating layer is polished until a portion of the isolating photoresist is exposed, the isolating photoresist is removed to provide additional partitioning slots in the plating layer, and the seed layer is then cut along the partitioning slots and the additional partitioning slots.

[5] The method for producing a light-emitting diode according to any one of [1] to [3] above, in the plating step, following formation of the seed layer, an isolating photoresist is formed along boundary portions that mutually isolate the plurality of reflective p-type electrodes, and the plating layer is then formed so as to cover the isolating photoresist, a partitioning step of forming partitioning slots in the laminated semiconductor layer on a side of the light extraction surface side and along the isolating photoresist at the boundary portions is provided between the removal step and the electrode formation step, and a partitioning step is provided in which, following the electrode formation step, the plating layer is polished until a portion of the isolating photoresist is exposed, and a mechanical stress is then applied, thereby partitioning the laminated semiconductor layer and the plating layer along the partitioning slots.

[6] The method for producing a light-emitting diode according to [4] or [5] above, wherein an insulating film formation step of forming a protective insulating film on each partitioning surface of the semiconductor layer that has been partitioned into a plurality of segments by the partitioning slots is provided between the partitioning step and the electrode formation step.

[7] The method for producing a light-emitting diode according to [6] above, wherein a surface roughening step of roughening the light extraction surface of the n-type semiconductor layer is provided between the insulating film formation step and the electrode formation step.

EFFECT OF THE INVENTION

By providing a plating layer, the present invention is able to realize an upper-lower electrode structure and resolve the problem of heat dissipation. Further, the present invention does not require an annealing treatment during formation of the ohmic electrode, and therefore degradation of the ohmic electrode within the light-emitting diode and deterioration in the current-voltage characteristics can be prevented.

DESCRIPTION OF THE REFERENCE SYMBOLS

Figure 1:
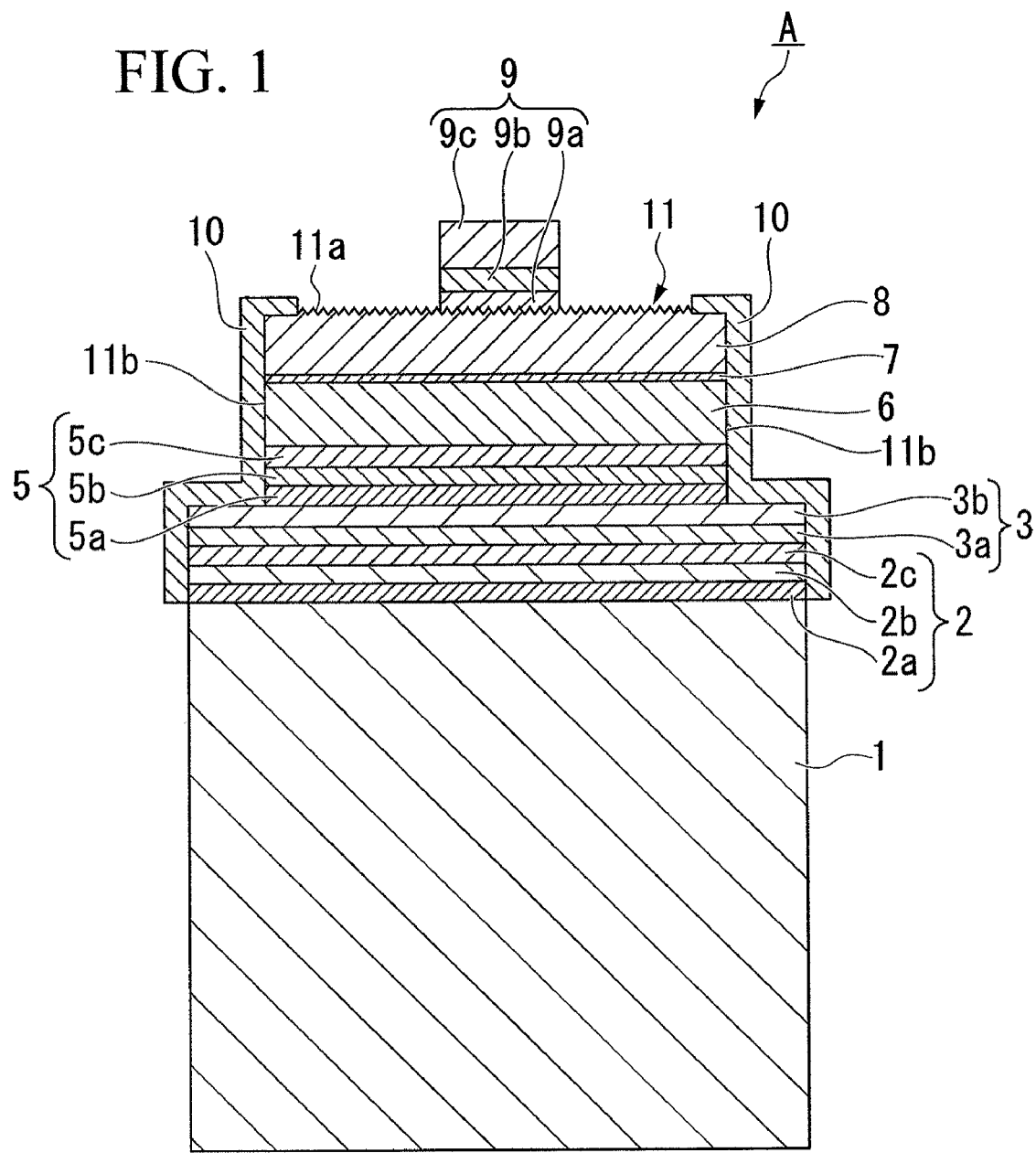
FIG. 1 is a schematic cross-sectional view illustrating a light-emitting diode that represents an embodiment of the present invention.
Figure 2:
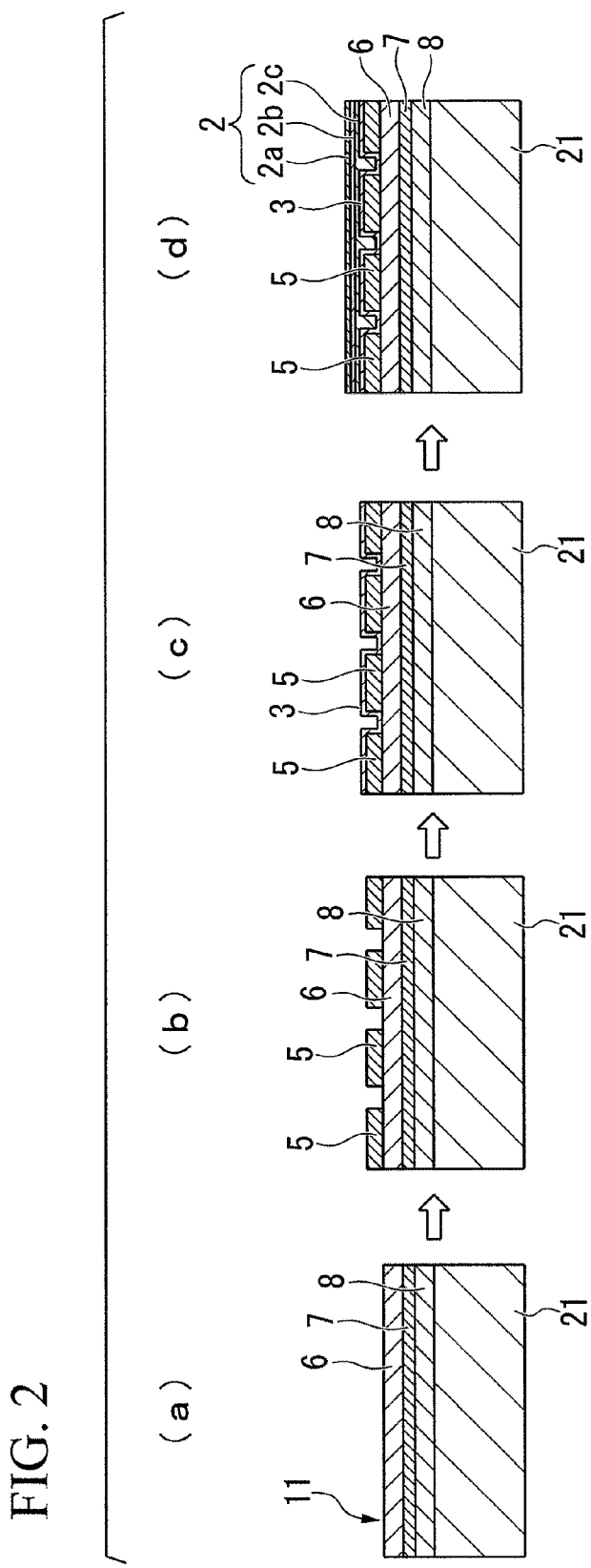
FIG. 2 is a process diagram describing a method for producing a light-emitting diode that represents an embodiment of the present invention.
Figure 3:
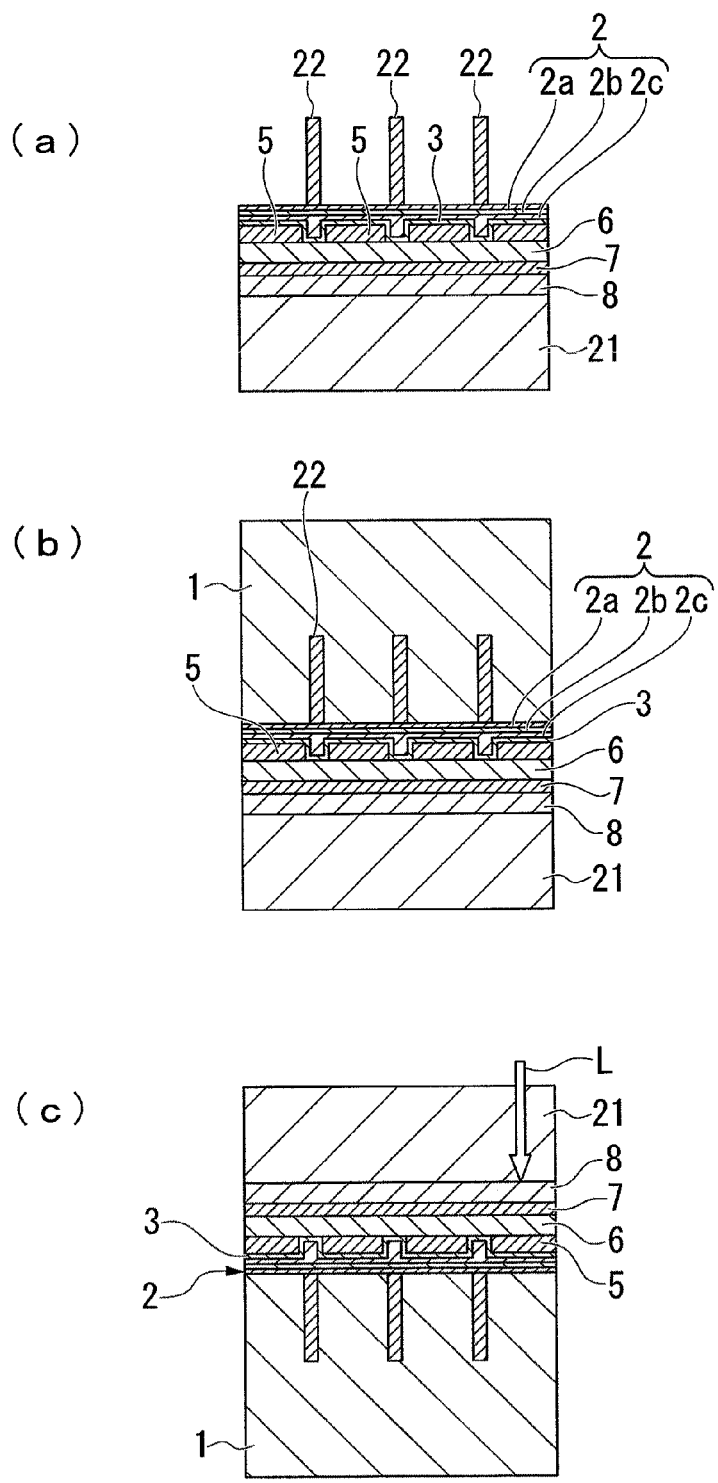
FIG. 3 is a process diagram describing a method for producing a light-emitting diode that represents an embodiment of the present invention.
Figure 4:
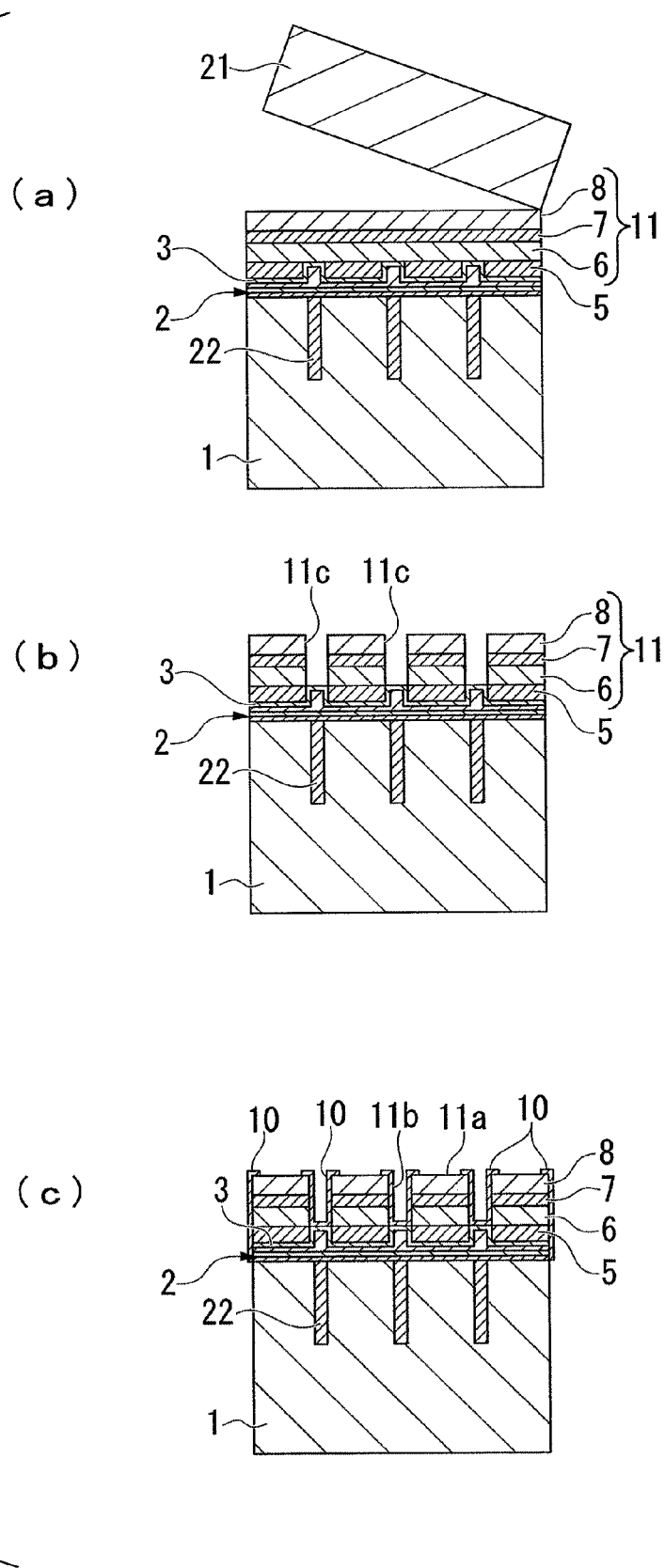
FIG. 4 is a process diagram describing a method for producing a light-emitting diode that represents an embodiment of the present invention.
Figure 5:
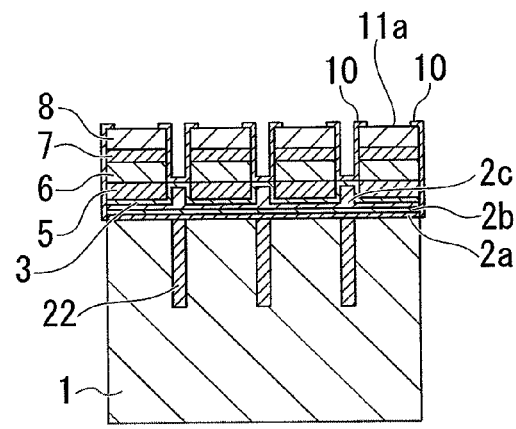
FIG. 5 is a process diagram describing a method for producing a light-emitting diode that represents an embodiment of the present invention.
Figure 5:
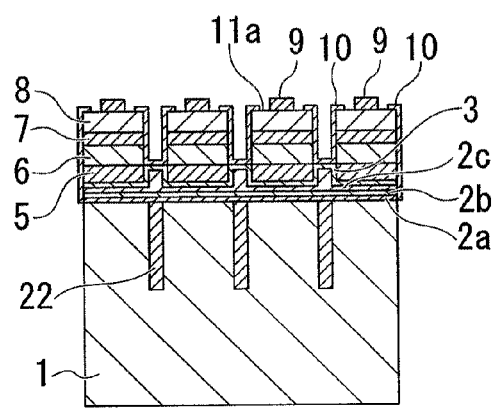
Figure 5:
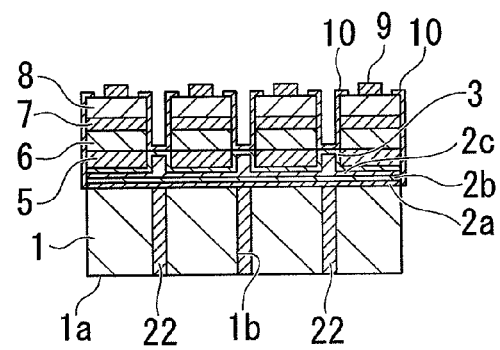
Figure 5:
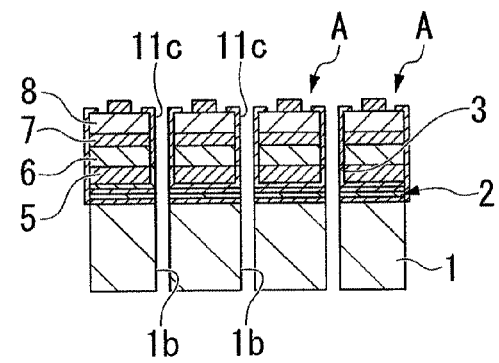

1: Plating layer
1b: Additional partitioning slots
2: Seed layer
5: Reflective p-type electrode
6: p-type semiconductor layer
7: Light-emitting layer
8: n-type semiconductor layer
9: n-type electrode
10: Protective insulating film
11a: Light extraction surface
11: Laminated semiconductor layer
11b: Partitioning surface
11c: Partitioning slot
21: Substrate
22: Isolating photoresist
A: Light-emitting diode

BEST MODE FOR CARRYING OUT THE INVENTION

A light-emitting diode and a method for producing the same that represents an embodiment of the present invention is described below with appropriate reference to the drawings. FIG. 1 is a schematic cross-sectional view illustrating a light-emitting diode of this embodiment, and FIG. 2 to FIG. 5 are process diagrams describing the method for producing the light-emitting diode. The drawings referred to in the following description are drawings describing the light-emitting diode and the method for producing the same, and the size, thickness and dimensions and the like of the various components illustrated differ from the dimensional relationships observed in an actual light-emitting diode or the like.

[Light-Emitting Diode]

A light-emitting diode A illustrated in FIG. 1 is composed basically of a plating layer 1 that functions as a base material, a seed layer 2 disposed on top of the plating layer 1, a barrier layer 3 disposed on top of the seed layer 2, a reflective p-type electrode 5 disposed on top of the barrier layer 3, a laminated semiconductor layer 11 disposed on top of the reflective p-type electrode 5, and an n-type electrode 9 disposed on top of the laminated semiconductor layer 11.

The n-type electrode 9 makes ohmic contact with the n-type semiconductor layer 8 of the laminated semiconductor layer 11, thereby functioning as the negative electrode of the laminated semiconductor layer 11. The n-type electrode 9 illustrated in FIG. 1 has a three-layer structure composed of a Cr film 9a that contacts the n-type semiconductor layer 8, a Ti film 9b that is laminated onto the Cr film 9a, and an Au film 9c that is laminated onto the Ti film 9b. The structure of the n-type electrode 9 is not restricted to this type of three-layer structure, and a four-layer structure prepared by laminating a Ti film, an Al film, a Ti film and an Au film may also be used.

As described below, this n-type electrode 9 is formed by dry etching a light extraction surface 11a, and then sequentially laminating the Cr film 9a, the Ti film 9b and the Au film 9c, and this enables ohmic contact with the n-type semiconductor layer 8 to be achieved without performing an annealing treatment.

The reflective p-type electrode 5 is connected electrically to the plating layer 1 via the barrier layer 3 and the seed layer 2, meaning the plating layer 1 functions as the extraction electrode for the reflective p-type electrode 5. Further, the reflective p-type electrode 5 and plating layer 1, and the n-type electrode 9 are disposed on opposite sides of the laminated semiconductor layer 11 in the thickness direction. Accordingly, the light-emitting diode A of this embodiment is a light-emitting diode having a so-called upper-lower electrode structure.

The laminated semiconductor layer 11 is produced by laminating a p-type semiconductor layer 6, a light-emitting layer 7 and an n-type semiconductor layer 8. The upper surface of the laminated semiconductor layer 11 functions as the light extraction surface 11a for extracting light from the light-emitting layer 7 into the external environment, and the n-type electrode 9 is formed on top of this light extraction surface 11a. Further, the light extraction surface 11a is roughened via an etching treatment or the like, which enhances the light extraction efficiency for the light-emitting diode A.

Further, a protective insulating film 10 formed from an insulating material such as $SiO_2$ is formed on the side surfaces 11b of the laminated semiconductor layer 11 and around the outer peripheral region of the light extraction surface 11a. This protective insulating film 10 extends as far as the side surfaces of the reflective p-type electrode 5, the barrier layer 3 and the seed layer 2. By forming the protective insulating film 10, short-circuits between the n-type semiconductor layer 8 and the p-type semiconductor layer 6 caused by foreign substances can be prevented, even in those cases where foreign substances adhere to the side surfaces 1b of the laminated semiconductor layer 11.

As illustrated in FIG. 1, the reflective p-type electrode 5 is disposed beneath the laminated semiconductor layer 11. The reflective p-type electrode 5 makes ohmic contact with the p-type semiconductor layer 6 of the laminated semiconductor layer 11, thereby functioning as the positive electrode of the laminated semiconductor layer 11.

Further, as illustrated in FIG. 1, the reflective p-type electrode 5 is composed of an ohmic contact layer 5c that contacts the laminated semiconductor layer 11, a reflective layer 5b that contacts the ohmic contact layer 5c, and an interdiffusion prevention layer 5a that contacts the reflective layer 5b. By providing the reflective layer 5b, the reflective p-type electrode 5 is able to function as a reflective layer that reflects the light from the light-emitting layer 7 towards the light extraction surface 11a.

As described below, the reflective p-type electrode 5 is formed by laminating the ohmic contact layer 5c using an RF sputtering method, and then laminating the reflective layer 5b and the interdiffusion prevention layer 5a using, for example, a DC sputtering method, and this enables ohmic contact with the laminated semiconductor layer 11 to be achieved without performing an annealing treatment.

The property required of the ohmic contact layer 5c is that it exhibits a low contact resistance with the p-type semiconductor layer 6. In terms of achieving a low contact resistance with the p-type semiconductor layer 6, the material for the ohmic contact layer 5c is preferably a platinum group material such as Pt, Ru, Os, Rh, Ir or Pd, or Ag, is more preferably Pt, Ir, Rh or Ru, and is most preferably Pt. The use of Ag is preferable in terms of achieving favorable reflection, but the contact resistance is higher than Pt. Accordingly, Ag can be used in those applications where the contact resistance is not particularly critical. The thickness of the ohmic contact layer 5c is preferably 0.1 nm or greater in order to ensure that a low contact resistance can be achieved with good stability. A thickness of 1 nm or greater is more preferred, as it yields a more uniform contact resistance.

The reflective layer 5b, which is formed from a Ag alloy or Al alloy or the like, is laminated to the ohmic contact layer 5c. Materials such as Pt, Ir, Rh, Ru, Os and Pd exhibit lower levels of reflectance than Ag alloys for visible light to the ultraviolet light region. Consequently, the light from the light-emitting layer 7 is not adequately reflected, making it difficult to achieve an element having a high output. Accordingly, forming the ohmic contact layer 5c thin enough to allow satisfactory transmission of the light, and then forming the reflective layer 5b of an Ag alloy or the like so as to generate reflected light yields a more favorable ohmic contact and enables the fabrication of an element with a higher output. In this case, the thickness of the ohmic contact layer 5c is preferably 30 nm or less, and is more preferably 10 nm or less. In order to achieve favorable reflectance, the thickness of the reflective layer 5b is preferably 0.1 nm or greater. A thickness of 1 nm or greater is more preferred, as it yields more uniform adhesion. Ag alloys are prone to migration and are therefore the reflective layer 5b is preferably thin. Accordingly, the film thickness is preferably 200 nm or less.

The interdiffusion prevention layer 5a is formed to prevent interdiffusion of the constituent elements of the reflective layer 5b and the constituent elements of the barrier layer 3 described below. The use of Pt or the like as the interdiffusion prevention layer 5a is preferred.

As illustrated in FIG. 1, the barrier layer 3 is formed beneath the reflective p-type electrode 5. As described below, the barrier layer 3 is a layer that acts as a barrier during the production of partitioning slots within the laminated semiconductor layer 11 by dry etching or the like following the formation of the laminated semiconductor layer 11 on a sapphire substrate, and is a laminated film composed of a Ni film 3b and an Au film 3a. The thickness of the Ni film 3b is typically within a range from approximately 20 to 200 nm, and the thickness of the Au film 3a is typically within a range from approximately 50 to 300 nm. Further, the overall thickness of the barrier layer 3 is typically within a range from 70 to 500 nm.

This barrier layer 3 is not necessarily an essential component member of the light-emitting diode A, and if the seed layer 2 or the reflective p-type electrode 5 can be imparted with barrier properties, then the barrier layer 3 may be omitted.

As illustrated in FIG. 1, the seed layer 2 is disposed beneath the barrier layer 3. The seed layer 2 is the layer that acts as the underlayer during formation of the plating layer 1 using a plating method, and is a laminated film composed of a Ti film 2c, a Ta film 2b and a Cu film 2a. Further, the seed layer 2 may also be a single-layer film formed from Cu. The thickness of the Ti film 2c is typically within a range from approximately 100 to 300 nm, the thickness of the Ta film 2b is typically within a range from approximately 200 to 700 nm, and the thickness of the Cu film 2a is typically within a range from approximately 100 to 500 nm. Furthermore, the overall thickness of the seed layer 2 is typically within a range from approximately 400 to 1,500 nm. The Ta film 2b functions as a barrier for the Cu.

This seed layer 2 is not necessarily an essential component member of the light-emitting diode A, and if the barrier layer 3 or the reflective p-type electrode 5 can be imparted with properties that enable function as an underlayer for plating, then the seed layer 2 may be omitted.

The plating layer 1 is a metal layer formed, for example, by an electroplating method using the seed layer 2 as an underlayer. The material of the plating layer 1 is preferably compatible with the material of the seed layer 2, and in the present embodiment, the plating layer 1 is preferably Cu, which is the same material as that of the Cu film 2a of the seed layer 2.

Further, Cu is also preferred as the base material for the light-emitting diode A having an upper-lower electrode structure due to its low electrical resistance and high thermal conductivity. The thickness of the plating layer 1 is typically approximately 150 μm. By providing the plating layer 1, the heat dissipation efficiency of the light-emitting diode A can be enhanced.

The laminated semiconductor layer 11 is formed basically from the p-type semiconductor layer 6, the light-emitting layer 7 and the n-type semiconductor layer 8.

Conventional semiconductor light-emitting materials such as GaN-based single crystals, GaP-based single crystals, GaAs-based singe crystals and ZnO-based single crystals can be used as the laminated semiconductor layer 11, although in terms of enabling epitaxial growth on a substrate described below formed from a sapphire single crystal or a SiC single crystal, GaN-based single crystals and ZnO-based single crystals are preferred, and GaN-based single crystals are particularly desirable.

A multitude of GaN-based semiconductors represented by general formula: $Al_XGa_YIn_ZN_{1-A}M_A$ (wherein $0 \leq X \leq 1$, $0 \leq Y \leq 1$ and $0 \leq Z \leq 1$, provided that $X+Y+Z=1$, the symbol M represents a group-V element other than nitrogen (N), and $0 \leq A < 1$) are already known as semiconductor layers formed from GaN-based single crystals, and in the present invention, any GaN-based semiconductor represented by general formula: $Al_XGa_YIn_ZN_{1-A}M_A$ (wherein $0 \leq X \leq 1$, $0 \leq Y \leq 1$ and $0 \leq Z \leq 1$, provided that $X+Y+Z=1$, the symbol M represents a group-V element other than nitrogen (N), and $0 \leq A < 1$), including all of the known GaN-based semiconductors, can be used without any particular restrictions.

The n-type semiconductor layer 8 is produced by laminating an underlayer, an n-contact layer, and an n-cladding layer that contacts the light-emitting layer 7. The n-contact layer may include the functions of the underlayer and/or the n-cladding layer.

The underlayer is preferably composed of an $Al_xGa_{1-x}N$ layer (wherein, $0 \leq x \leq 1$, preferably $0 \leq x \leq 0.5$, and more preferably $0 \leq x \leq 0.1$). The thickness of the underlayer is typically 0.1 μm or greater, preferably 0.5 μm or greater, and more preferably 1 μm or greater. Ensuring a thickness that is not less than the above limit facilitates the formation of an $Al_xGa_{1-x}N$ layer having favorable crystallinity.

The underlayer may be doped with an n-type impurity, provided the doping concentration is within a range from $1 \times 10^{17}$ to $1 \times 10^{19}/cm^3$, but an undoped layer ($<1 \times 10^{17}/cm^3$) is preferred in terms of maintaining favorable crystallinity. There are no particular limitations on the n-type impurity, and examples include Si, Ge and Sn, and of these, Si and Ge are preferred, and Si is more preferred.

In a similar manner to the underlayer, the n-contact layer is preferably composed of an $Al_xGa_{1-x}N$ layer (wherein, $0 \leq x \leq 1$, preferably $0 \leq x \leq 0.5$, and more preferably $0 \leq x \leq 0.1$).

Further, the n-contact layer is preferably doped with an n-type impurity, and incorporating the n-type impurity at a concentration of $1 \times 10^{17}$ to $1 \times 10^{19}/cm^3$, and preferably $1 \times 10^{18}$ to $1 \times 10^{19}/cm^3$ is preferred in terms of maintaining a favorable ohmic contact with the n-type electrode 9, suppressing the occurrence of cracking, and maintaining a favorable degree of crystallinity. There are no particular limitations on the n-type impurity, and examples include Si, Ge and Sn, and of these, Si and Ge are preferred, and Si is particularly desirable.

The GaN-based semiconductor that constitutes the n-contact layer is preferably of the same composition as the underlayer, and the combined thickness of the n-contact layer and the underlayer is typically set within a range from 1 to 20 μm, preferably from 2 to 15 μm, and more preferably from 3 to 12 μm. Provided the combined thickness of the n-contact layer and the underlayer is within this range, the crystallinity of the semiconductor can be favorably maintained.

An n-cladding layer is preferably disposed between the n-contact layer and the light-emitting layer 7. The n-cladding layer is able to compensate for any deterioration in the smoothness of the surface of the n-contact layer. The n-cladding layer can be formed using AlGaN, GaN or GaInN or the like. Further, the n-cladding layer may be either a heterojunction of these structures or a superlattice structure formed by laminating a plurality of layers. Needless to say, when the n-cladding layer is formed of GaInN, it is preferable that the band gap is larger than the band gap of the GaInN of the light-emitting layer 7.

Although there are no particular limitations on the thickness of the n-cladding layer, the thickness is preferably within a range from 0.005 to 0.5 μm, and is more preferably from 0.005 to 0.1 μm. The n-type dopant concentration within the n-cladding layer is preferably within a range from $1 \times 10^{17}$ to $1 \times 10^{20}/cm^3$, and is more preferably from $1 \times 10^{18}$ to $1 \times 10^{19}/cm^3$. A dopant concentration within this range is preferred in terms of maintaining favorable crystallinity and reducing the operating voltage of the light-emitting element.

In the present invention, the light-emitting layer 7 laminated beneath the n-type semiconductor layer 8 is typically a light-emitting layer formed from a GaN-based semiconductor, and preferably a $Ga_{1-s}In_sN$ (wherein $0<s<0.4$) GaN-based semiconductor. There are no particular restrictions on the thickness of the light-emitting layer 7, although the thickness should yield a quantum effect, namely satisfy the critical thickness, and is preferably within a range from 1 to 10 nm, and more preferably from 2 to 6 nm. A thickness for the light-emitting layer 7 within this range is preferred in terms of the light emission output.

Further, besides the single quantum well (SQW) structure described above, the light-emitting layer 7 may also adopt a multiple quantum well (MQW) structure containing an abovementioned $Ga_{1-s}In_sN$ well layer, and an $Al_cGa_{1-c}N$ (wherein $0 \leq c < 0.3$) barrier layer that has a larger band gap energy than the well layer. Furthermore, the well layer and the barrier layer may be doped with impurities.

The p-type semiconductor layer 6 is a laminated film composed of a p-cladding layer that contacts the light-emitting layer 7, and a p-contact layer. However, the p-contact layer may also function as a p-type cladding layer.

There are no particular limitations on the p-cladding layer, provided it has a composition that exhibits a larger band gap energy than that of the light-emitting layer 7 and is capable of confining a carrier in the light-emitting layer 7, although examples of preferred layers include those formed of $Al_dGa_{1-d}N$ (wherein $0<d\leq0.4$, and preferably $0.1\leq d\leq0.3$). A p-cladding layer composed of this type of AlGaN is preferred in terms of confining a carrier in the light-emitting layer 7. Although there are no particular restrictions on the thickness of the p-cladding layer, the thickness is preferably within a range from 1 to 400 nm, and is more preferably from 5 to 100 nm. The p-type dopant concentration within the p-cladding layer is preferably within a range from $1\times10^{18}$ to $1\times10^{21}/cm^3$, and is more preferably from $1\times10^{19}$ to $1\times10^{20}/cm^3$. A p-type dopant concentration within this range enables a favorable p-type crystal to be obtained with no deterioration in the crystallinity.

The p-contact layer is a GaN-based semiconductor layer that contains at least $Al_eGa_{1-e}N$ (wherein $0\leq e<0.5$, preferably $0\leq e\leq0.2$, and more preferably $0\leq e\leq0.1$). An Al composition within the above range is preferred in terms of maintaining a favorable degree of crystallinity and achieving favorable ohmic contact with the reflective p-type electrode 5. Incorporating a p-type impurity (dopant) at a concentration of $1\times10^{18}$ to $1\times10^{21}/cm^3$, and preferably $5\times10^{19}$ to $5\times10^{20}/cm^3$, within the p-contact layer is preferred in terms of maintaining favorable ohmic contact, preventing the occurrence of cracking, and maintaining a favorable degree of crystallinity. There are no particular limitations on the p-type impurity, although Mg is preferred. Although there are no particular restrictions on the thickness of the p-contact layer, the thickness is preferably within a range from 0.01 to 0.5 μm, and is more preferably from 0.05 to 0.2 μm. A thickness within this range is preferred in terms of the light emission output.

[Method for Producing Light-Emitting Diode]

A method for producing the light-emitting diode A is described below with reference to FIG. 2 to FIG. 5. The method for producing the light-emitting diode A according to the present embodiment comprises a lamination step of forming the laminated semiconductor layer 11 on top of the substrate 21 and forming the reflective p-type electrodes 5, a plating step of forming the seed layer 2 and forming the plating layer 1 on top of the seed layer 2, a removal step of removing the substrate 21, a partitioning step of forming partitioning slots in the light extraction surface side of the laminated semiconductor layer 11, an insulating film formation step of forming the protective insulating film 10 on the partitioning surfaces of the laminated semiconductor layer 11, a surface roughening step of roughening the surface of the light extraction surface 11a of the n-type semiconductor layer 8, an electrode formation step of performing dry etching of the light extraction surface 11a of the n-type semiconductor layer 8 and subsequently forming the n-type electrode 9, and a dicing step of providing additional partitioning slots in the plating layer 1 and then cutting the seed layer 2 along the partitioning slots and the additional partitioning slots.

Each of these steps is described below with reference to the drawings.

[Lamination Step]

As illustrated in FIG. 2(a) and FIG. 2(b), the n-type semiconductor layer 8, the light-emitting layer 7 and the p-type semiconductor layer 6 are laminated sequentially on the substrate 21 to form the laminated semiconductor layer 11, and a plurality of reflective p-type electrodes 5 are then formed on the p-type semiconductor layer 6, with one reflective p-type electrode 5 formed for each unit that is to become an element.

Specifically, firstly as illustrated in FIG. 2(a), the n-type semiconductor layer 8, the light-emitting layer 7 and the p-type semiconductor layer 6 are laminated sequentially onto the substrate 21, thus forming the laminated semiconductor layer 11.

The n-type semiconductor layer 8 is preferably doped with Si or the like as the n-type dopant, while the p-type semiconductor layer 6 is preferably doped with Mg or the like as the p-type dopant.

Moreover, when forming the laminated semiconductor layer 11 on the substrate 21, it is desirable to previously form a buffer layer on the substrate 21. In other words, in those cases where a sapphire substrate is used as the substrate 21 and a GaN layer is formed as the n-type semiconductor layer 8, the lattice constants for the substrate 21 and the n-type semiconductor layer 8 differ by 10% or more. In such cases, by using an AlN or AlGaN layer or the like having a lattice constant that is between those of the substrate 21 and the n-type semiconductor layer 8 as a buffer layer, the crystallinity of the GaN that constitutes the n-type semiconductor layer 8 can be improved.

The n-type semiconductor layer 8, the light-emitting layer 7 and the p-type semiconductor layer 6 are then laminated sequentially onto the buffer layer to form the laminated semiconductor layer 11. There are no particular restrictions on the method used for growing the laminated semiconductor layer 11, any of the methods generally known as crystal growth methods for GaN-type semiconductors can be used, including sputtering method, MOCVD method (Metal-Organic Chemical Vapor Deposition method), HVPE method (Hydride Vapor Phase Epitaxy method), and MBE method (Molecular Beam Epitaxy method). From the viewpoints of controlling the film thickness and applicability to mass production, sputtering method and MOCVD method are preferred as the crystal growth method.

In a sputtering method, the GaN-based semiconductor is preferably formed using a so-called reactive sputtering method, using a target containing Ga and a mixed gas of argon and nitrogen as the plasma gas.

Further, in the case of a MOCVD method, hydrogen ($H_2$) or nitrogen ($N_2$) can be used as the carrier gas, trimethyl gallium (TMG) or triethyl gallium (TEG) can be used as the Ga source that represents the group-III raw material, trimethyl aluminum (TMA) or triethyl aluminum (TEA) can be used as the Al source, trimethyl indium (TMI) or triethyl indium (TEI) can be used as the In source, and ammonia ($NH_3$) or hydrazine ($N_2H_4$) can be used as the N source that represents the group-V raw material. Further, in terms of n-type dopants, monosilane ($SiH_4$) or disilane ($Si_2H_6$) can be used as the Si raw material, and germane gas ($GeH_4$) or an organogermanium compound such as tetramethyl germanium (($CH_3$)$_4$Ge) or tetraethyl germanium (($C_2H_5$)$_4$Ge) can be used as the Ge raw material.

In an MBE method, elemental germanium may also be used as the dopant source. For the p-type dopant, biscyclopentadienyl magnesium ($Cp_2Mg$) or bisethylcyclopentadienyl magnesium ($EtCp_2Mg$) may be used as the Mg raw material.

Subsequently, as illustrated in FIG. 2(b), an ohmic contact layer, a reflective layer and an adhesive layer are laminated sequentially onto the p-type semiconductor layer 6 of the laminated semiconductor layer 11, and patterning is then performed using a photolithography technique to form the reflective p-type electrodes 5.

Formation of the ohmic contact layer on top of the p-type semiconductor layer 6 is preferably conducted using a sputtering film deposition method using an RF discharge. By employing a sputtering film deposition method that uses an RF discharge, an electrode can be formed that has a lower contact resistance than those obtainable using vapor deposition method or DC discharge sputtering deposition method. In other words, by forming the ohmic contact layer by sputtering film deposition using an RF discharge, the constituent elements of the p-type semiconductor layer 6 become mixed within the ohmic contact layer, and the constituent elements of the ohmic contact layer become mixed within the p-type semiconductor layer 6, thus generating an ohmic junction between the ohmic contact layer and the p-type semiconductor layer 6.

In sputtering film deposition using an RF discharge, it is thought that an ion assist effect imparts energy to sputtered atoms adhered to the p-type semiconductor layer 6, thereby promoting surface diffusion within the p-type semiconductor such as a Mg-doped p-GaN. Moreover, in the film deposition described above, it is thought that energy is also imparted to the atoms at the outermost surface of the p-type semiconductor layer 6, thereby promoting diffusion of the semiconductor material such as Ga within the ohmic contact layer.

Film deposition using an RF discharge has an effect of reducing the contact resistance in the initial stages of the deposition, but as the film thickness increases, because the film is sparse, the film tends to exhibit inferior reflectance to a film formed by deposition using a DC discharge. Accordingly, a thin-film ohmic contact layer that retains a low degree of contact resistance and a high level of light transmittance is preferably formed by RF discharge, with a reflective layer and interdiffusion prevention layer then being formed on this ohmic contact layer using a DC discharge.

As described above, by forming the ohmic contact layer using an RF sputtering method, an ohmic contact can be achieved between the ohmic contact layer and the p-type semiconductor layer 6. In this case, annealing need not be conducted after the formation of the ohmic contact layer. Rather, annealing is actually undesirable, as it may promote the diffusion of Pt and Ga, causing a reduction in the crystallinity of the semiconductor and a resulting deterioration in the electrical properties. Accordingly, following formation of the ohmic contact layer, it is preferable that no heat treatment is conducted that involves heating at a temperature higher than 350° C.

The sputtering may be performed using a conventional sputtering apparatus, with appropriate selection of conventional conditions. The substrate 21 with the laminated semiconductor layer 11 laminated thereon is housed inside the sputtering chamber, and the substrate temperature is set within a range from room temperature to 500° C. Heating of the substrate is not particularly necessary, but a suitable degree of heating may be used to promote diffusion of the constituent elements of the ohmic contact layer and the constituent elements of the p-type semiconductor layer 6. The inside of the chamber is typically evacuated to a degree of vacuum within a range from $10^{-4}$ to $10^{-7}$ Pa.

As the sputtering gas, gases such as He, Ne, Ar, Kr and Xe may be used. In terms of availability, the use of Ar is preferred. One of these gases is introduced into the chamber, and once the pressure has been adjusted to 0.1 to 10 Pa, a discharge is generated. A pressure within a range from 0.2 to 5 Pa is preferred. The electric power supplied is preferably within a range from 0.2 to 2.0 kW. The thickness of the deposited layer can be adjusted by appropriate regulation of the discharge time and the supplied power.

Similar effects can be achieved by using a vacuum deposition method to faun the ohmic contact layer on the p-type semiconductor layer 6.
[Plating Step]

As illustrated in FIG. 2(c) to FIG. 3(b), the barrier layer 3 and the seed layer 2 are formed so as to cover the reflective p-type electrodes 5 and the p-type semiconductor layer 6, an isolating photoresist 22 is formed along the boundary portions that mutually isolate the reflective p-type electrodes 5 from one another, and the plating layer 1 is then formed on top of the seed layer 2 so as to cover the isolating photoresist 22. Conventional materials can be used for forming the isolating photoresist 22.

Specifically, as illustrated in FIG. 2(c), the barrier layer 3 is formed by sequentially laminating a Ni film and an Au film so as to cover the reflective p-type electrodes 5 and the p-type semiconductor layer 6. Subsequently, as illustrated in FIG. 2(d), the seed layer 2 is formed by sequentially laminating the Ti film 2c, the Ta film 2b and the Cu film 2a so as to cover the barrier layer 3.

Next, as illustrated in FIG. 3(a), the isolating photoresist 22 is formed in a substantially grid-like shape when viewed in a planar view, along the boundary portions that mutually isolate the reflective p-type electrodes 5 from one another. The isolating photoresist 22 may be formed, for example, with a height of approximately 300 µm and a width of approximately several tens of µm.

Subsequently, as illustrated in FIG. 3(b), the plating layer 1 is formed so as to cover the seed layer 2 and the isolating photoresist 22. The plating layer 1 may be formed by applying an electric current to the seed layer 2 and performing electroplating. The thickness of the plating layer 1 is typically within a range from approximately 1.0 to 2 mm.
[Removal Step]

In the subsequent removal step, as illustrated in FIG. 3(c) to FIG. 4(a), the buffer layer and the substrate 21 are removed from the n-type semiconductor layer 8, thereby exposing the underlayer.

Any of the conventional techniques such as polishing methods, etching methods or laser lift-off methods can be used without any particular limitations for removing the buffer layer and the substrate 21, although in the present embodiment, a laser lift-off method is preferred in terms of productivity.

Specifically, as illustrated in FIG. 3(c), a laser light L is irradiated along the vicinity of the interface between the buffer layer and the substrate 21, thereby causing thermal decomposition of mainly the buffer layer. As illustrated in FIG. 4(a), this results in the separation of the substrate 21 from the n-type semiconductor layer 8. By removing the substrate 21 and the buffer layer from the n-type semiconductor layer 8, the surface of the n-type semiconductor layer 8 that was bonded to the buffer layer is exposed.
[Partitioning Step]

In the subsequent partitioning step, as illustrated in FIG. 4(b), partition slots 11c are formed in the laminated semiconductor layer 11 on the side of the light extraction surface 11a, along the isolating photoresist 22 formed at the boundary portions.

Specifically, as illustrated in FIG. 4(b), a mask is formed on top of the laminated semiconductor layer 11, and a technique such as dry etching is used to etch the laminated semiconductor layer 11 in a grid-like shape, thus forming the partitioning slots 11c, which have a substantially grid-like shape when viewed in a planar view, in the laminated semiconductor layer 11. The etching is ended when the barrier layer 3 is exposed. The partitioning slots 11c are preferably formed so as to substantially overlap with the isolating photoresist 22. In this manner, the laminated semiconductor layer 11 is partitioned into a plurality of segments by the grid-shaped partitioning slots 11c.

[Insulating Film Formation Step]

In the subsequent insulating film formation step, as illustrated in FIG. 4(c), the protective insulating film 10 is formed on each of the side surfaces (partitioning surfaces) 11b of the laminated semiconductor layer 11, which has been partitioned into a plurality of segments by the partitioning slots 11c.

Specifically, as illustrated in FIG. 4(c), a CVD method or sputtering method or the like is used to form a protective insulating film 10 composed of $SiO_2$ that covers each of the side surfaces 11b of the laminated semiconductor layer 11, the portions of the barrier layer 3 that are exposed between segments of the laminated semiconductor layer 11, and the outer peripheral region of the light extraction surface 11a of each of the segments of the laminated semiconductor layer 11. The targeted protective insulating film 10 can be formed by forming a protective insulating film 10 across the entire laminated semiconductor layer 11, forming a resist that covers the entire insulating film 10 besides the portions in the center of each of the light extraction surfaces 11a, and then performing dry etching or the like.

[Surface Roughening Step]

Next, the light extraction surface 11a of the n-type semiconductor layer 8 is roughened in the surface roughening step.

Specifically, the structure is dipped in a heated KOH solution, thereby removing those portions of the underlayer of the n-type semiconductor layer 8 that are not covered by the insulating film 10, namely those portions exposed within the center of each of the light extraction surfaces 11a, as well as roughening the surface of the light extraction surface 11a of the n-type semiconductor layer 8.

Removal of the underlayer may also be performed using PEC (Photo electrochemical etch).

Further, dry etching may also be used for removing the underlayer and roughening the surface of the light extraction surface 11a.

The above operation of removing the underlayer is required in those cases where the underlayer is an undoped layer, but if the underlayer has been doped with Si or the like, then the underlayer removal operation is unnecessary.

[Electrode Formation Step]

In the electrode formation step, as illustrated in FIG. 5(a) and FIG. 5(b), the light extraction surface 11a of the n-type semiconductor layer 8 is subjected to dry etching with an etching gas that contains the same element as the dopant element within the n-type semiconductor layer 8, and an n-type electrode 9 is then formed on each segment of the light extraction surface 11a.

Specifically, as illustrated in FIG. 5(a), the plated substrate including the plating layer 1, the reflective p-type electrodes 5 and the laminated semiconductor layer 11 and the like is mounted in the chamber of a plasma dry etching apparatus, a reaction gas composed of an etching gas containing the same element as the dopant element within the n-type semiconductor layer 8 is supplied to the chamber, and a plasma is generated above the laminated semiconductor layer 11, thereby dry etching the light extraction surface 11a with a plasma containing the etching gas.

In those cases where the dopant element within the n-type semiconductor layer 8 is silicon (Si), the use of a silicon halide as the etching gas is preferred, and specific examples of preferred silicon halides include $SiCl_4$ and $SiF_4$.

Further, the pressure within the chamber upon introduction of the reaction gas is preferably within a range from 0.2 to 2 Pa, the flow rate of the etching gas is preferably within a range from 15 to 50 sccm, the plasma power is preferably approximately 120 W, the bias is preferably approximately 50 W, and the treatment time is typically approximately 150 seconds.

Moreover, the etching rate is preferably not less than 5 nm/minute and not more than 100 nm/minute. If the etching rate exceeds 100 nm/minute, then the heat resistance of the produced ohmic contact tends to deteriorate. A more preferred etching rate is not less than 5 nm/minute and not more than 40 nm/minute, and a particularly preferred etching rate is not less than 5 nm/minute and not more than 25 nm/minute.

It is thought that by conducting this type of etching treatment, the Si contained within the etching gas is blasted into the surface of the n-type semiconductor layer 8, thereby increasing the Si concentration in the vicinity of the surface.

Subsequently, as illustrated in FIG. 5(b), a Cr film, a Ti film and an Au film are laminated sequentially onto the plasma-treated n-type semiconductor layer 8, thus forming the n-type electrode 9. The structure of the n-type electrode 9 is not limited to this type of three-layer structure, and a four-layer structure prepared by laminating a Ti film, an Al film, a Ti film and an Au film may also be used. Formation of the n-type electrode 9 can be conducted using a sputtering method or a vapor deposition method or the like.

As described above, by treating the surface of the n-type semiconductor layer 8 with a plasma, and then laminating a Cr film or a Ti film or the like, an ohmic contact can be achieved between the Cr film or Ti film of the n-type electrode 9 and the n-type semiconductor layer R. In this case, annealing need not be conducted after the formation of the n-type electrode 9. Rather, annealing is actually undesirable, as it may cause a deterioration in the electrical properties.

[Dicing Step]

In the dicing step, as illustrated in FIG. 5(c) and FIG. 5(d), the plating layer 1 is polished until a portion of the isolating photoresist 22 is exposed, the isolating photoresist 22 is removed, thus forming additional partitioning slots 1b in the plating layer 1, and the seed layer 2 is then cut along the partitioning slots 11c and the additional partitioning slots 1b.

Specifically, as illustrated in FIG. 5(c), the surface of the plating layer 1 on the opposite side to the laminated semiconductor layer 11 is first subjected to polishing using a technique such as CMP, thereby exposing the isolating photoresist 22.

Next, the isolating photoresist 22 is removed by dissolution or ashing, thus forming the additional partitioning slots 1b in the plating layer 1. These additional partitioning slots 1b are provided in positions that correspond with the previously formed partitioning slots 11c in the laminated semiconductor layer 11. The only components remaining between the additional partitioning slots 1b of the plating layer 1 and the partitioning slots 11c of the laminated semiconductor layer 11 are the seed layer 2 and the barrier layer 3. The combined thickness of the seed layer 2 and the barrier layer 3 is typically approximately 1 µm.

Subsequently, as illustrated in FIG. 5(d), the seed layer 2 and the barrier layer 3 remaining between the partitioning slots 11c and the additional partitioning slots 1b are subjected to dicing, thus yielding a plurality of light-emitting diodes A.

An additional partitioning step may be performed instead of the dicing step. In other words, following the electrode formation step, the plating layer 1 is polished to expose a portion of the isolating photoresist 22 in the same manner as that illustrated in FIG. 5(c), and with the isolating photoresist 22 left within the structure, a mechanical stress may then be applied, thereby partitioning the laminated semiconductor layer 11 and the plating layer 1 along the partitioning slots 11c and forming a plurality of light-emitting diodes A.

As described above, according to the method for producing the light-emitting diode A of the present embodiment, because the light extraction surface 11a of the n-type semiconductor layer 8 is subjected to dry etching using an etching gas (such as $SiCl_4$ or $SiF_4$) containing the same element as the dopant element (such as Si) within the n-type semiconductor layer 8, and the n-type electrode 9 is then formed on the light extraction surface 11a, ohmic contact between the n-type semiconductor layer 8 and the n-type electrode 9 can be achieved without performing an annealing treatment. As a result, there is no possibility of impairing the reflectance of the previously formed reflective p-type electrode 5, and there is no possibility of causing thermal diffusion or the like between the semiconductor layers that constitute the laminated semiconductor layer 11, meaning a light-emitting diode A having excellent light extraction efficiency and excellent light emission efficiency can be produced.

Furthermore, according to the method for producing the light-emitting diode A of the present embodiment, by forming the plating layer 1 on the laminated semiconductor layer 11, and subsequently removing the substrate 21, a light-emitting diode A having a so-called upper-lower electrode structure in which the laminated semiconductor layer 11 is sandwiched between the n-type electrode 9 and the reflective p-type electrode 5 can be formed. The light-emitting diode A obtained in this manner includes a plating layer 1 composed of Cu or the like, and is therefore able to readily dissipate the heat that is generated at the same time as the light emission.

Furthermore, according to the abovementioned method for producing the light-emitting diode A, because the seed layer 2 is formed and the plating layer 1 is then formed on the seed layer 2, the plating layer 1 can be bonded powerfully via the seed layer 2, enabling the production of a light-emitting diode A having excellent mechanical strength.

Further, according to the abovementioned method for producing the light-emitting diode A, because the reflective p-type electrode 5 is formed using an RF sputtering method, ohmic contact between the reflective p-type electrode 5 and the p-type semiconductor layer 6 can be achieved without performing an annealing treatment. As a result, there is no possibility of a portion of the Mg that functions as the dopant element within the reflective p-type electrode 5 being lost as a result of an annealing treatment, the dopant concentration within the p-type semiconductor layer 6 can be maintained at a uniform level, and there is no possibility of a deterioration in the current-voltage characteristics of the light-emitting diode A.

Furthermore, according to the abovementioned method for producing the light-emitting diode A, because the plating layer 1 is formed so as to cover the isolating photoresist 22, and the isolating photoresist 22 is subsequently removed to generate the additional partitioning slots 1b within the plating layer 1, not only is a dicing operation not required for segmenting the plating layer 1, but the dicing operation need only cut through the seed layer 2 and the barrier layer 3, meaning that the partitioning of the light-emitting diodes A can be conducted with relative ease.

Furthermore, in the abovementioned method for producing the light-emitting diode A, the plating layer 1 may be formed so as to cover the isolating photoresist 22, the plating layer 1 subsequently polished to expose the isolating photoresist 22, and a mechanical stress then applied to partition the light-emitting diodes A, and in this case, a dicing operation for segmenting the plating layer 1 is unnecessary, and the partitioning of the light-emitting diodes A can be conducted with relative ease.

EXAMPLES

An example of the method for producing a light-emitting diode according to the present invention is described below, although the present invention is in no way limited by the examples presented below.

Example 1

A light-emitting diode A illustrated in FIG. 1 was prepared in the manner described below.

Namely, a buffer layer of thickness 40 nm composed of AlN was formed on a substrate composed of sapphire, and an undoped GaN underlayer of thickness 2 µm, a Si-doped n-type GaN contact layer of thickness 2 µm and an n-type $In_{0.1}Ga_{0.9}N$ cladding layer of thickness 20 nm (the n-type semiconductor layer), a light-emitting layer having a multiple quantum well structure in which a Si-doped GaN barrier layer of thickness 15 nm and an $In_{0.2}Ga_{0.8}N$ well layer of thickness 2 nm were laminated 5 times and finally provided with a barrier layer, and a Mg-doped p-type $Al_{0.1}Ga_{0.9}N$ cladding layer of thickness 10 nm and a Mg-doped p-type $Al_{0.02}Ga_{0.98}N$ contact layer of thickness 200 nm (the p-type semiconductor layer) were laminated sequentially onto the buffer layer, yielding a laminated semiconductor layer.

Subsequently, an ohmic contact layer of thickness 2 nm, a reflective layer of thickness 100 nm and an interdiffusion prevention layer of thickness 50 nm were laminated sequentially onto the p-type semiconductor layer, and then patterning using photolithography technology was used to form reflective p-type electrodes. The ohmic contact layer on the p-type semiconductor layer was formed by a sputtering deposition method using an RF discharge. Further, the reflective layer and the interdiffusion prevention layer were found by a DC sputtering method.

Subsequently, a Ni film of thickness 100 nm and an Au film of thickness 200 nm were laminated sequentially by the vapor deposition method so as to cover the reflective p-type electrodes and the p-type semiconductor layer, thus forming a barrier layer.

A Ti film of thickness 200 nm, a Ta film of thickness 400 nm and a Cu film of thickness 300 nm were then laminated sequentially on top of the barrier layer using a sputtering method, thus forming a seed layer.

Subsequently, an isolating photoresist was formed, in a substantially grid-like shape when viewed in a planar view, along the boundary portions that mutually isolate the reflective p-type electrodes from one another. The isolating photoresist was formed with a height of 150 µm and a width of approximately 60 µm.

Next, by applying an electric current to the seed layer and performing electroplating, a plating layer that covered the seed layer and the isolating photoresist was formed with a thickness of approximately 1.2 mm.

A laser lift-off method was then used to remove the buffer layer and the sapphire substrate from the n-type semiconductor layer.

Subsequently, a grid-shaped pattern of partitioning slots was formed in the laminated semiconductor layer using a dry etching method. The etching was stopped once the barrier layer had been exposed. The partitioning slots were formed so as to substantially overlap with the isolating photoresist.

Next, an insulating film formed from $SiO_2$ and having a thickness of 460 nm was formed by a CVD method on each of the side surfaces of the laminated semiconductor layer that had been partitioned into a plurality of segments by the partitioning slots.

A heated KOH solution treatment was then performed on the light extraction surface of the n-type semiconductor layer, thereby roughening the surface of the light extraction surface.

Subsequently, the light extraction surface of the n-type semiconductor layer was subjected to dry etching with $SiCl_4$. Specifically, the plated substrate including the laminated semiconductor layer was mounted in the chamber of a plasma dry etching apparatus, $SiCl_4$ gas was supplied to the chamber as the reaction gas, and a plasma was generated above the laminated semiconductor layer, thereby etching the light extraction surface.

The pressure inside the chamber upon introduction of the reaction gas was set to 0.5 Pa, the flow rate of the etching gas was set to 30 sccm, the plasma power was set to 120 W, the bias was set to 50 W, and the treatment time was set to 150 seconds.

Subsequently, a Cr film of thickness 40 nm, a Ti film of thickness 100 nm and an Au film of thickness 1,000 nm were laminated sequentially by the vapor deposition method onto the dry etched n-type semiconductor layer, thus forming an n-type electrode.

The plating layer was then polished until a portion of the isolating photoresist was exposed, and the isolating photoresist was removed by a dissolution method, thus forming additional partitioning slots in the plating layer. The barrier layer and the seed layer were then cut between the partitioning slots and the additional partitioning slots.

In this manner, 1,000 μm square light-emitting diodes of example 1 were produced.

Comparative Example 1

With the exception of not performing the plasma treatment, preparation of light-emitting diodes was conducted in the same manner as example 1, yielding light-emitting diodes of comparative example 1.

When the Vf values at 20 mA were measured for the light-emitting diodes of example 1 and comparative example 1, the light-emitting diode of example 1 that had undergone the plasma treatment exhibited a Vf value of 3.20 V. In contrast, the Vf value for the light-emitting diode of comparative example 1 that had not undergone the plasma treatment was 3.76 V, an increase of 0.56 V from the result for example 1.

Figure 6:
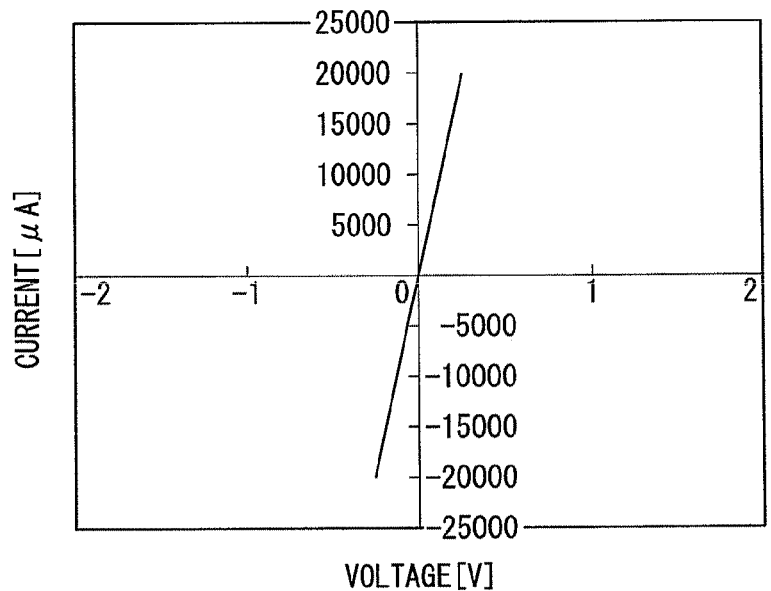
FIG. 6 is a graph illustrating the current-voltage characteristics between an n-type electrode and an n-type semiconductor layer in Example 1.
Figure 7:
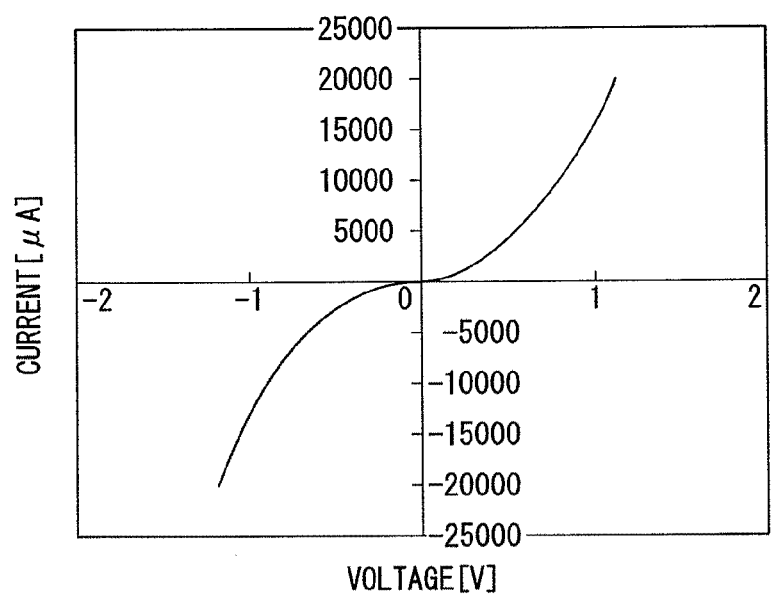
FIG. 7 is a graph illustrating the current-voltage characteristics between an n-type electrode and an n-type semiconductor layer in Comparative Example 1.

Further, when the current-voltage characteristics between the n-type electrode and the n-type semiconductor layer were measured for example 1 and comparative example 1, example 1 yielded the results illustrated in FIG. 6, and comparative example 1 yielded the results illustrated in FIG. 7. As is evident from FIG. 6, for example 1, the relationship between the current and the voltage was a linear relationship in which the current and voltage were mutually proportional, making it clear that an ohmic junction had been formed between the n-type electrode and the n-type semiconductor layer.

In contrast, as is evident from FIG. 7, the current and the voltage did not adopt a linear relationship in comparative example 1, making it clear that an ohmic junction had not been formed between the n-type electrode and the n-type semiconductor layer.

From the description above it is clear that by conducting a plasma treatment prior to formation of the n-type electrode, ohmic contact can be achieved between the n-type electrode and the n-type semiconductor layer without performing an annealing treatment.

INDUSTRIAL APPLICABILITY

According to the present invention, by providing a plating layer, an upper-lower electrode structure can be realized and the problem of heat dissipation can be resolved. Further, because an annealing treatment need not be conducted during formation of the ohmic electrode, degradation of the ohmic electrode in the light-emitting diode and deterioration in the current-voltage characteristics can be prevented.

The invention claimed is:

1. A method for producing a light-emitting diode, said method comprising:
   a lamination step of forming a laminated semiconductor layer by sequentially laminating an n-type semiconductor layer, a light-emitting layer and a p-type semiconductor layer onto a substrate, as well as forming a plurality of reflective p-type electrodes on top of the p-type semiconductor layer,
   a plating step of forming a seed layer that covers the reflective p-type electrodes and the p-type semiconductor layer, and forming a plating layer on top of the seed layer,
   a removal step of removing the substrate from the n-type semiconductor layer, thereby exposing a light extraction surface of the n-type semiconductor layer, and
   an electrode formation step of performing dry etching of the light extraction surface of the n-type semiconductor layer using an etching gas comprising an identical element to a dopant element within the n-type semiconductor layer, and subsequently forming an n-type electrode on the light extraction surface.

2. The method for producing a light-emitting diode according to claim 1, wherein the dopant element within the n-type semiconductor layer is silicon, and the etching gas is a silicon halide.

3. The method for producing a light-emitting diode according to claim 1, wherein in the lamination step, the reflective p-type electrodes are formed using an RF sputtering method.

4. The method for producing a light-emitting diode according to claim 1, wherein
   in the plating step, following formation of the seed layer, an isolating photoresist is formed along boundary portions that mutually isolate the plurality of reflective p-type electrodes, and the plating layer is then formed so as to cover the isolating photoresist,
   a partitioning step of forming partitioning slots in the laminated semiconductor layer on a side of the light extraction surface side and along the isolating photoresist at the boundary portions is provided between the removal step and the electrode formation step, and a dicing step is provided in which, following the electrode formation step, the plating layer is polished until a portion of the isolating photoresist is exposed, the isolating photoresist is removed to provide additional partitioning slots in the plating layer, and the seed layer is then cut along the partitioning slots and the additional partitioning slots.

5. The method for producing a light-emitting diode according to claim 1, wherein
   in the plating step, following formation of the seed layer, an isolating photoresist is formed along boundary portions that mutually isolate the plurality of reflective p-type electrodes, and the plating layer is then formed so as to cover the isolating photoresist,
   a partitioning step of forming partitioning slots in the laminated semiconductor layer on a side of the light extraction surface side and along the isolating photoresist at the boundary portions is provided between the removal step and the electrode formation step, and
   an additional partitioning step is provided in which, following the electrode formation step, the plating layer is polished until a portion of the isolating photoresist is exposed, and a mechanical stress is then applied, thereby partitioning the laminated semiconductor layer and the plating layer along the partitioning slots.

6. The method for producing a light-emitting diode according to claim 4, wherein an insulating film formation step of forming a protective insulating film on each partitioning surface of the semiconductor layer that has been partitioned into a plurality of segments by the partitioning slots is provided between the partitioning step and the electrode formation step.

7. The method for producing a light-emitting diode according to claim 5, wherein an insulating film formation step of forming a protective insulating film on each partitioning surface of the semiconductor layer that has been partitioned into a plurality of segments by the partitioning slots is provided between the partitioning step and the electrode formation step.

8. The method for producing a light-emitting diode according to claim 6, wherein a surface roughening step of roughening the light extraction surface of the n-type semiconductor layer is provided between the insulating film formation step and the electrode formation step.

9. The method for producing a light-emitting diode according to claim 7, wherein a surface roughening step of roughening the light extraction surface of the n-type semiconductor layer is provided between the insulating film formation step and the electrode formation step.

10. The method for producing a light-emitting diode according to claim 2, wherein in the lamination step, the reflective p-type electrodes are formed using an RF sputtering method.

11. The method for producing a light-emitting diode according to claim 2, wherein
in the plating step, following formation of the seed layer, an isolating photoresist is formed along boundary portions that mutually isolate the plurality of reflective p-type electrodes, and the plating layer is then formed so as to cover the isolating photoresist,
a partitioning step of forming partitioning slots in the laminated semiconductor layer on a side of the light extraction surface side and along the isolating photoresist at the boundary portions is provided between the removal step and the electrode formation step, and
a dicing step is provided in which, following the electrode formation step, the plating layer is polished until a portion of the isolating photoresist is exposed, the isolating photoresist is removed to provide additional partitioning slots in the plating layer, and the seed layer is then cut along the partitioning slots and the additional partitioning slots.

12. The method for producing a light-emitting diode according to claim 2, wherein
in the plating step, following formation of the seed layer, an isolating photoresist is formed along boundary portions that mutually isolate the plurality of reflective p-type electrodes, and the plating layer is then formed so as to cover the isolating photoresist,
a partitioning step of forming partitioning slots in the laminated semiconductor layer on a side of the light extraction surface side and along the isolating photoresist at the boundary portions is provided between the removal step and the electrode formation step, and
an additional partitioning step is provided in which, following the electrode formation step, the plating layer is polished until a portion of the isolating photoresist is exposed, and a mechanical stress is then applied, thereby partitioning the laminated semiconductor layer and the plating layer along the partitioning slots.

* * * * *